United States Patent
Hargreaves et al.

(10) Patent No.: US 8,217,811 B2
(45) Date of Patent: Jul. 10, 2012

(54) BITCOUNT DETERMINATION FOR ITERATIVE SIGNAL CODING

(75) Inventors: David Hargreaves, Cambridge (GB); Esfandiar Zavarehei, Cambridge (GB)

(73) Assignee: Cambridge Silicon Radio Limited (GB)

( * ) Notice: Subject to any disclaimer, the term of this patent is extended or adjusted under 35 U.S.C. 154(b) by 102 days.

(21) Appl. No.: 12/679,719

(22) PCT Filed: Sep. 9, 2008

(86) PCT No.: PCT/GB2008/050805
§ 371 (c)(1),
(2), (4) Date: Mar. 24, 2010

(87) PCT Pub. No.: WO2009/053728
PCT Pub. Date: Apr. 30, 2009

(65) Prior Publication Data
US 2010/0201549 A1    Aug. 12, 2010

(30) Foreign Application Priority Data

Oct. 24, 2007 (GB) .................................. 0720861.4

(51) Int. Cl.
*H03M 7/34* (2006.01)
(52) U.S. Cl. .............. 341/51; 341/63; 341/65; 341/67; 341/106; 341/107; 704/224; 704/230; 375/240.01; 375/240.12
(58) Field of Classification Search .............. 341/51, 341/63, 65, 67, 106, 107; 704/224, 230; 375/240.01, 240.12, 240.24
See application file for complete search history.

(56) References Cited

U.S. PATENT DOCUMENTS

| | | | |
|---|---|---|---|
| 4,455,649 A | 6/1984 | Esteban et al. | |
| 6,037,985 A * | 3/2000 | Wong | 375/240.03 |
| 6,449,395 B1 | 9/2002 | Kobayashi | |
| 6,601,032 B1 | 7/2003 | Surucu | |
| 6,639,942 B1 * | 10/2003 | Bayazit | 375/240.01 |
| 6,668,015 B1 | 12/2003 | Kranawetter et al. | |
| 6,847,656 B1 * | 1/2005 | Wu et al. | 370/477 |
| 6,865,224 B1 * | 3/2005 | Knee et al. | 375/240.03 |
| 7,272,181 B2 * | 9/2007 | Bayazit | 375/240.01 |
| 7,299,175 B2 * | 11/2007 | Chen et al. | 704/224 |
| 8,019,601 B2 * | 9/2011 | Eguchi | 704/230 |
| 2002/0150157 A1 | 10/2002 | Lin et al. | |
| 2003/0083867 A1 | 5/2003 | Lopez-Estrada et al. | |
| 2004/0105491 A1 * | 6/2004 | Bayazit | 375/240.01 |
| 2004/0105586 A1 * | 6/2004 | Bayazit | 382/232 |
| 2005/0041689 A1 * | 2/2005 | Wu et al. | 370/477 |
| 2006/0176953 A1 | 8/2006 | Mohsenian | |
| 2008/0077413 A1 * | 3/2008 | Eguchi | 704/500 |

OTHER PUBLICATIONS

Manu Mathew et al., Modified MP3 Encoder Using Complex Modified Discrete Cosine Transform, Multimedia and Expo, 2003. Proceedings. 2003 International Conference on Jul. 6-9, 2003, Piscataway, NJ, USA, IEEE, vol. 2, Jul. 6, 2003, pp. 709-712.

* cited by examiner

*Primary Examiner* — Linh Nguyen
(74) *Attorney, Agent, or Firm* — Greenberg Traurig, LLP (57) ABSTRACT

Methods and apparatus for iteratively encoding a portion of a signal are described in which the portion of the signal is quantised and an output bit count is estimated based on the sum of logarithms to base n of values of each sample in the plurality of quantised samples and the total number of samples. The output bit count corresponds to an estimate of the output bit count for the portion of the signal once encoded using a code, such as a Huffman code.

16 Claims, 5 Drawing Sheets

BITCOUNT DETERMINATION FOR ITERATIVE SIGNAL CODING

BACKGROUND

There are a number of possible encoding methods which may be used to compress audio files. Constant bitrate (CBR) encoding provides a constant rate output from a codec, i.e. a CBR encoder uses the same frame size for every frame. This may be beneficial when audio files are to be streamed across a medium of fixed bandwidth (e.g. over a wireless channel) because an audio file can be encoded at a bitrate which matches the available bandwidth. However as the nature of an audio stream is typically very non-uniform, such CBR coding techniques use more bits than are required for simple passages whilst being limited in bit allocation for complex passages. Where a particular frame has a complex sound in it, the encoder reduces the quality of the signal until it can be encoded in the available number of bits.

Variable bitrate (VBR) encoding however can respond to the complexity of any particular passage and allocate more bits to complex passages and fewer bits to less complex passages. Problems may occur, however, when streaming VBR encoded files because the resultant bitrate is unpredictable and the receiver may only have a limited buffer.

A compromise between CBR and VBR is average bitrate encoding (ABR). In ABR the encoder has flexibility in allocating bits to frames dependent on the complexity of the signal in any particular frame whilst maintaining a target average bitrate over a defined time period. This results in a higher quality signal than CBR and a more predictable bitrate than VBR. However, as the encoder does not know in advance which portions of the audio are more complex and therefore require more bits, some form of bit rate adjustment is usually required in order to ensure that the target average bitrate is achieved.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Methods and apparatus for iteratively encoding a portion of a signal are described in which the portion of the signal is quantised and an output bit count is estimated based on the sum of logarithms to base n of values of each sample in the plurality of quantised samples and the total number of samples. The output bit count corresponds to an estimate of the output bit count for the portion of the signal once encoded using a code, such as a Huffman code.

A first aspect provides a method of iteratively encoding a portion of a signal comprising: quantising the portion of the signal to produce a plurality of quantised samples; and estimating an output bit count corresponding to the plurality of quantised samples encoded using a code, the estimated output bit count being based on a combination of logarithms to base n of values of each quantised sample and the total number of samples.

The combination of logarithms to base n of values of each quantised sample may comprise a sum of logarithms to base n of values of each quantised sample.

The method may further comprise: comparing the output bit count to target bit count criteria; and if the output bit count does not meet the target bit count criteria, adjusting a quantisation parameter; and repeating the quantising and estimating steps.

In an embodiment, n=2.

The step of estimating an output bit count corresponding to the plurality of quantised samples encoded using a code, based on a sum of logarithms to base n of values of each sample in the plurality of quantised samples may comprise estimating an output bit count using:

$$a_1 \sum_i \log_2(2|x_i|) + a_2$$

where $a_1$ and $a_2$ are predefined parameters and $x_i$ are values of each quantised sample.

The estimating step may be implemented using an instruction for detecting a number of sign bits of a number. In an example, the estimating step may comprise estimating an output bit count using:

$$b_1 \sum_i SIGNDET(x_i) + Nb_2$$

where N is the total number of samples, $b_1$ and $b_2$ are predefined parameters and SIGNDET represents the instruction for detecting the number of sign bits of a number.

The predefined parameters $b_1$ and $b_2$ may be selected according to one or more characteristics of the signal and/or according to the coding type.

The method may further comprise: comparing the output bit count to target bit count criteria; and if the output bit count meets the target bit count criteria, calculating an exact output bit count and adjusting values of $b_1$ and $b_2$ according to a difference between the output bit count and the calculated exact output bit count.

The values, of $x_i$, each quantised sample may comprise quantised MDCT values.

The signal may comprise an audio signal, such as one to be MP3 encoded, or a video signal.

The code may comprise a Huffman code.

A second aspect provides an encoder comprising: a quantiser arranged to quantise a portion of a signal to produce a plurality of quantised samples; and means for estimating an output bit count corresponding to the plurality of quantised samples encoded using a code, the output bit count being based on a combination of logarithms to base n of values of each quantised sample and a total number of samples.

The combination of logarithms to base n of values of each quantised sample may comprise a sum of logarithms to base n of values of each quantised sample.

The encoder may further comprise: means for comparing the output bit count to target bit count criteria; wherein if the output bit count does not meet the target bit count criteria, the encoder is arranged to adjust a quantisation parameter and repeat the quantisation and output bit count estimation.

In an embodiment, n=2.

The means for estimating an output bit count may be arranged to estimate the output bit count using:

$$a_1 \sum_i \log_2(2|x_i|) + a_2$$

where $a_1$ and $a_2$ are predefined parameters and $x_i$ are values of each quantised sample.

The means for estimating an output bit count may be arranged to estimate the output bit count using an instruction for detecting the number of sign bits of a number. For example, the means for estimating an output bit count may be arranged to perform:

$$b_1 \sum_i SIGNDET(x_i) + Nb_2$$

where N is the total number of samples, $b_1$ and $b_2$ are predefined parameters and SIGNDET represents the instruction for detecting the number of sign bits of a number.

The predefined parameters $b_1$ and $b_2$ are selected according to one or more characteristics of the signal.

The values, $x_i$, of each quantised sample may comprise quantised MDCT values.

The signal may comprise an audio signal (such as one to be MP3 encoded) or a video signal.

The code may comprise a Huffman code.

The methods described herein may be performed by firmware or software in machine readable form on a tangible storage medium. The software can be suitable for execution on a parallel processor or a serial processor such that the method steps may be carried out in any suitable order, or simultaneously.

A third aspect provides a computer program arranged to perform any of the methods described herein. The computer program may be stored on a machine readable medium.

This acknowledges that firmware and software can be valuable, separately tradable commodities. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Common reference numerals are used throughout the figures to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Figure 1:
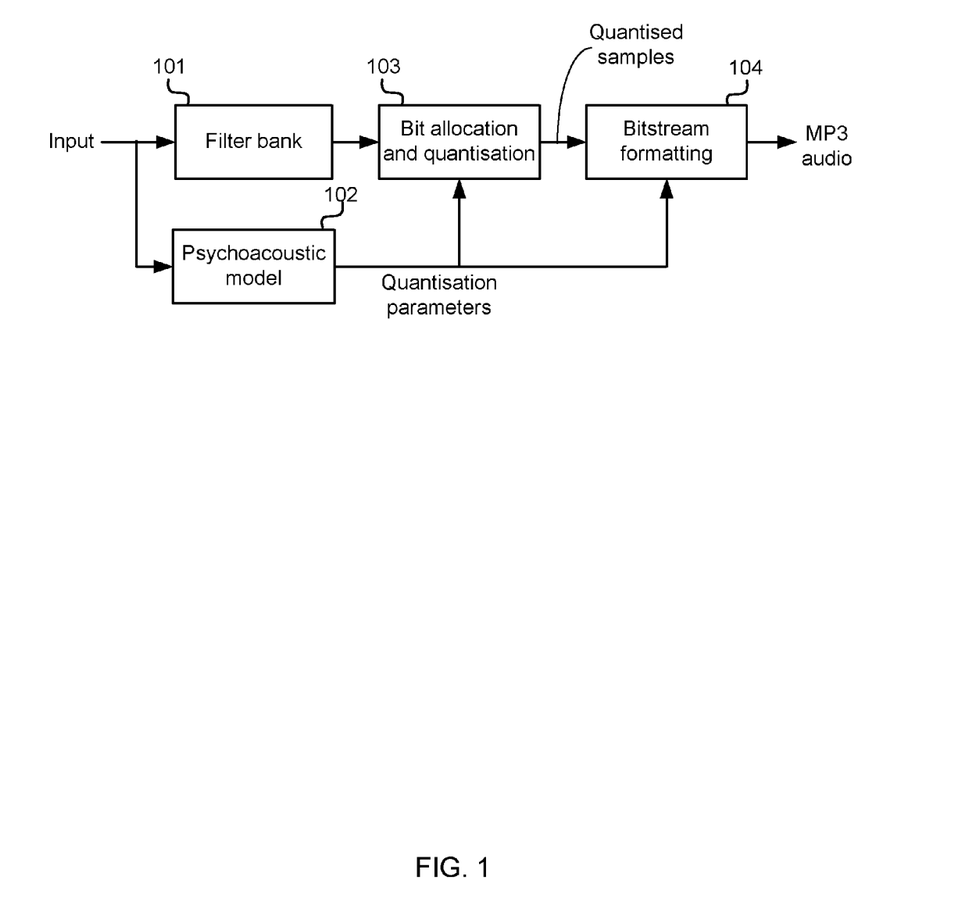
FIG. 1 is a schematic diagram of an MP3 encoder.

There are many techniques for encoding audio and/or video signals which use an iterative loop in order to optimise the quality or the perceived quality given a particular output bitrate or output data size. For example, a perceptual encoder, which may be used to encode an MP3 file, uses a psychoacoustic model to discard parts of the signal which are not perceptible to human hearing. FIG. 1 shows a schematic diagram of an MP3 encoder in which the input passes substantially simultaneously through a filter bank 101 and the psychoacoustic model 102. The psychoacoustic model 102 outputs a set of parameters including the quantisation levels used in quantisation and bit allocation (element 103), which outputs quantised samples. These quantised samples are then input to the bitstream formatting element 104 where they are formatted, for example by being coded using a Huffman code. The use of a psychoacoustic model enables the encoder to achieve high levels of compression without impacting the perceived signal quality. In performing such compression, the signal frames are iteratively encoded (e.g. through adjusting the quantisation step size) and the result bitrate determined until the target bitrate is achieved. This iteration may occur within element 103 and may also occur within element 104 or on a broader scale within the encoder. There may be multiple nested iterative loops to achieve the desired result, for example iterating the quantisation step size and scaling factors.

It will be appreciated that FIG. 1 shows the functional elements within an example MP3 encoder and there may be additional or fewer elements. Furthermore the elements may be combined in different ways without losing the overall effect and they may all be implemented, for example, within a single chip.

In order to perform the iterative encoding process, a number of techniques have been developed to calculate accurately the number of output bits from a coding method (e.g. the number of bits which will be output from the encoder once coded using a particular code or code table, given a set of quantised samples), however this step is processor intensive. Whilst such processor intensive methods may be suitable where processing power is not limited and where power consumption is not a concern (e.g. in a PC-based application), they may not be best suited to applications where power consumption is critical (e.g. battery powered embedded devices).

Figure 2:
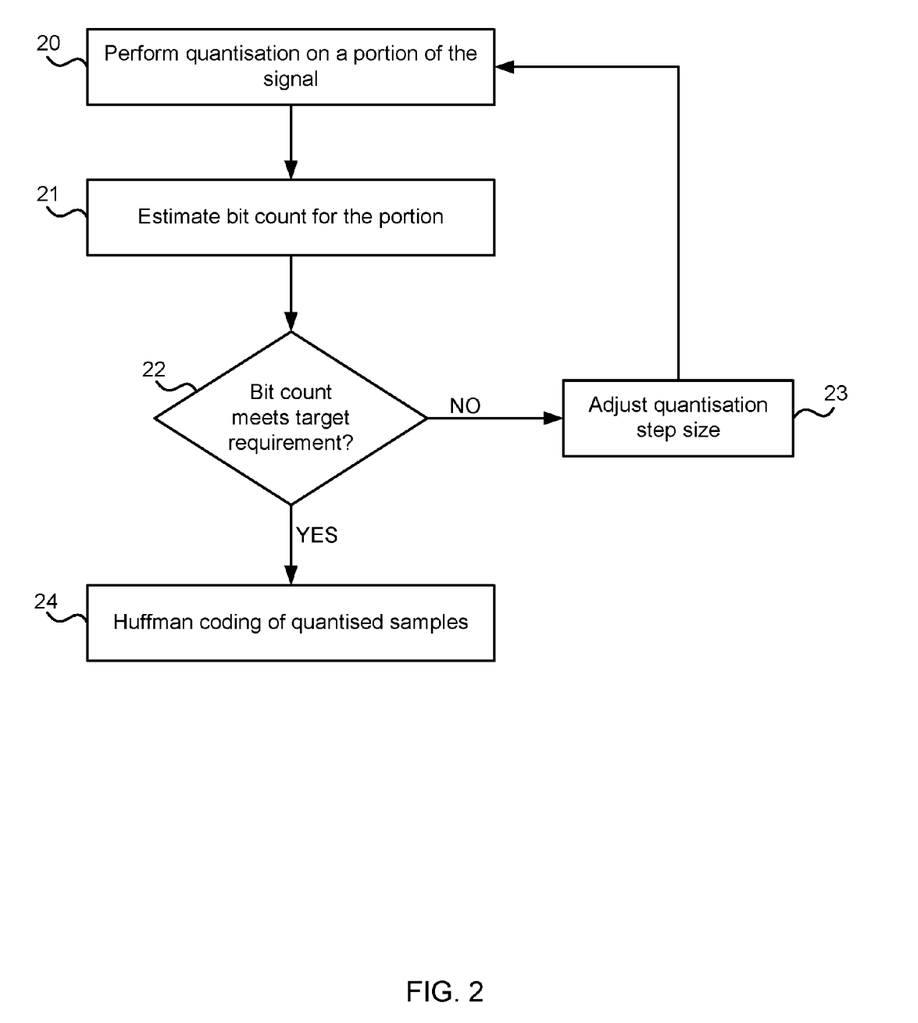
FIG. 2 shows a flow diagram of an example method of encoding an audio or video signal.

FIG. 2 shows a flow diagram of an example method of encoding an audio or video signal. Whilst the following examples are described in terms of MP3 (MPEG-1 Audio Layer 3), the methods described herein are applicable to other audio/video encoding formats, including, but not limited to, AAC (Advanced Audio Coding), WMA (Windows Media Audio).

According to the method, a portion of the audio/video signal is quantised (block 20) and the bit count for the portion (i.e. the number of output bits required) is estimated (block 21) rather than being accurately calculated. This estimation step is described in more detail below. The bit count is then compared to the target value (which may be a single value, a range of values or of any other form) and if the bit count does not meet the target value ('No' in block 22), the method is then iterated, e.g. by changing the quantisation step size or other parameter (in block 20), until the bit count matches the target value ('Yes' in block 22). At this point, the quantised values may be coded (block 24) using a particular code table, for example using a Huffman code table.

It will be appreciated that the flow diagram of FIG. 2 shows only a subset of the operations which occur within an encoder, such as the one shown in FIG. 1. Method blocks 20-23 may occur within the bit allocation and quantisation element 103 which may perform other functions including, but not limited to, one or more of: performing distortion calculations for critical bands, amplification of critical bands, etc. Method block 24 may be performed within the bitstream formatting element 104.

The estimation may be performed (in block 21) using the following algorithm which calculates the approximate code length, l, of a signed sample x:

$$l(x) = a_1 \log_2(2|x|) + a_2 \quad (1)$$

where $a_1$ and $a_2$ are predefined parameters. These parameters may be constants (e.g. during a granule or a frame) or may be variable. Using this equation, the number of output bits required for a portion of data, for example a granule of data (which comprises N samples) is given by:

$$\text{bit\_count} = \sum_{i=0}^{N-1} l(x) = a_1 \sum_{i=0}^{N-1} \log_2(2|x_i|) + Na_2 \quad (2)$$

N covers the region where the coding (e.g. Huffman coding) is used. For example in MP3 encoding this is:

$$N = 576 - rzero$$

where rzero is the number of zero samples at the end of the MDCT spectrum.

Although the sample length estimation using equation (1) may not be particularly accurate for an individual sample, the resultant bit count, with the lengths of samples summed over all the samples in a granule (as in equation (2)), provides an accurate estimate of the bit requirements of the granule. Some experimental results are described below and shown in FIGS. 3 and 4.

Whilst algorithm (1) was derived for quantised MDCT (modified discrete cosine transform) values, as used in perceptual audio codecs such as MP3, encoded using a Huffman code (such that l is the approximate length of a Huffman code for a signed sample value x), it is also more widely applicable to prefix-free codes and any codes which are established such that small numbers occur more frequently than large numbers. Other frequency analysis methods (other than MDCT) may be used, such as FFT (fast Fourier transform). The parameters $a_1$ and $a_2$ may vary dependent upon the type of signal which is quantised and the codes used.

This algorithm may be implemented within a DSP (digital signal processor) using an instruction which is designed to detect the number of sign bits of a number (e.g. for use in normalisation of a number or in fixed-point to floating-point conversion). The number of sign bits of a number may be defined as the number of positions by which the number is shifted in normalisation (this can alternatively be considered to be the number of positions by which the decimal position is moved) or the exponent of a normalised floating-point number. Examples of such an instruction include 'SIGNDET' (as used by CSR plc) and 'EXP' (as used by Analog Devices) and 'NORM' (as used by Texas Instruments). Such an instruction returns (using the SIGNDET instruction name by way of example only):

$$y = \text{SIGNDET}(x) = n - \lfloor \log_2 x + 0.5 \rfloor - 2 \quad (3)$$

where n is the precision of the processor and $\lfloor \ \rfloor$ rounds towards minus infinity.

Using such an instruction, the estimation of the bit count (block 21) can be approximately implemented on a DSP as:

$$\text{bit\_count} = b_1 \sum_{i=0}^{N-1} \text{SIGNDET}(x_i) + Nb_2 \quad (4)$$

where $b_1$ and $b_2$ are predefined parameters (e.g. constants).

Whilst the instruction 'SIGNDET' (and its equivalents used by other DSP manufacturers) itself is known, it was intended for use in normalisation of numbers and this is a new application and use for the instruction.

The values of $b_1$ and $b_2$ may be set such that the average error over the portion (in this case, a granule) is zero (or close to zero). These values of $b_1$ and $b_2$ can be determined based on one or more test samples by performing the estimation (using equation (2) or (4)) for one or many signals (and therefore many portions of a signal) and comparing the estimated values to the exact values calculated using a known method. The values of $b_1$ and $b_2$ may then be adjusted and the estimation repeated until the average error is small or zero. Different pairs of values of $b_1$ and $b_2$ may be used dependent upon the type of codes used, (referred to herein as the 'coding type'). An example of a coding type is Huffman coding.

The values of $b_1$ and $b_2$ used in a particular estimation may be selected from a set of possible parameter pairs based on the type of media signal, such as audio/video, speech/music, music genre (e.g. jazz, pop, classical) etc, where, for example, the values of $b_1$ and $b_2$ have been generated based on particular types of test samples or a single pair of values may be provided (e.g. where an encoder is only used for a single type of media signal, such as an MP3 encoder). Where the values are selected, this may be performed manually by a user (e.g. as a set-up parameter for the encoder) or may be performed automatically (e.g. based on metadata or tags associated with the media signal).

In an audio encoding example, for quantised MDCT values encoded using a Huffman code, the values of the parameters may be: $b_1 = -2.68$ and $b_2 = 61.92$ for a 24-bit processor.

Whilst the examples given above perform the bit count estimation on a per frame basis, this is by way of example only. The bit count estimation may be performed over any portion of the signal or over an entire file.

The implementation of the estimation (as shown in equation (4)) uses just two instructions on a DSP. This compares to around 16-20 instructions to perform the equivalent exact calculation using an existing encoder which has been highly optimised (e.g. the LAME v3.96 encoder).

Some example results are shown in the following table and in FIGS. 3 and 4.

| | |
|---|---|
| Average number of bits per frame @ 160 kbps | 4116 bits |
| Mean absolute error | 177 bits (=4.3%) |
| Standard deviation of error | 228 bits (=5.5%) |

Figure 3:
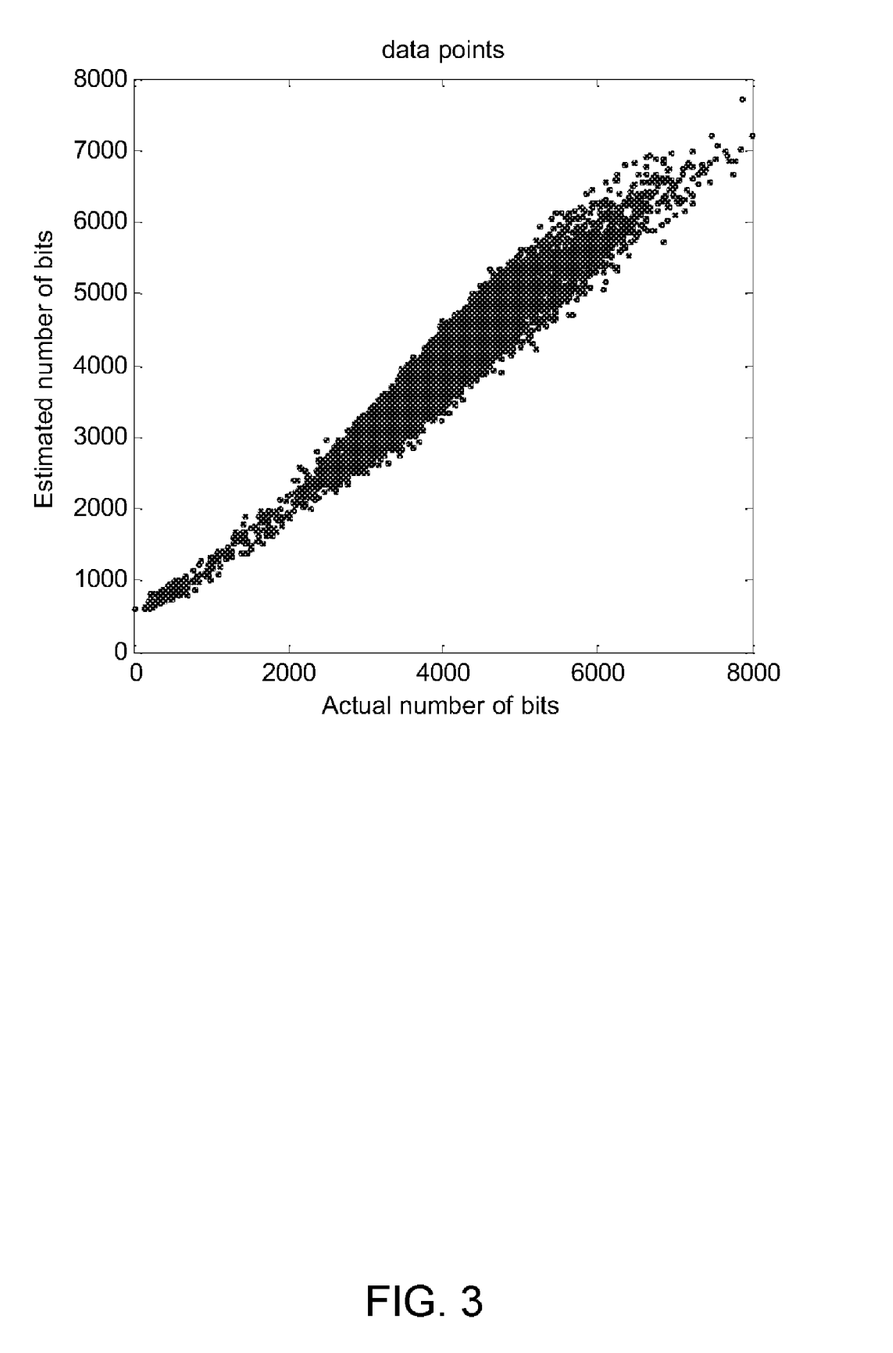
FIG. 3 shows a scattergram of an estimated number of bits versus the actual number of bits.
Figure 4:
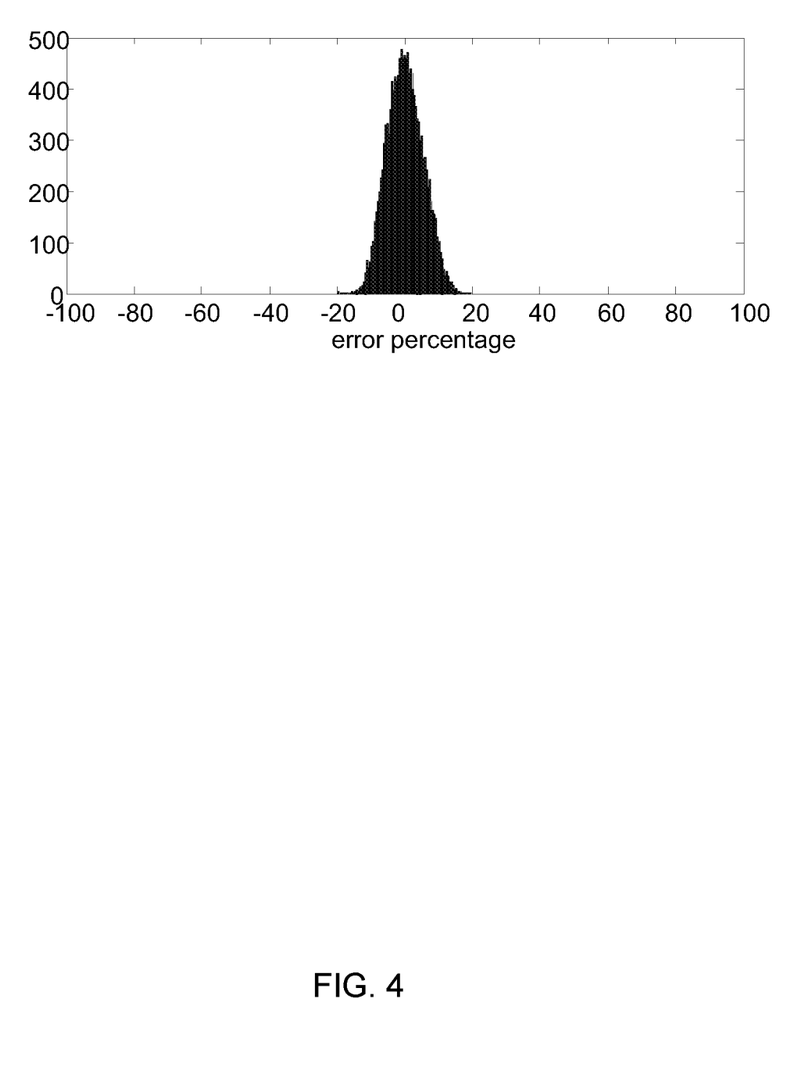
FIG. 4 shows a histogram of the error percentage between an estimated value and the actual number of bits per frame.

FIG. 3 shows a scattergram of estimated versus actual number of bits at a nominal bitrate of 160 kbps whilst FIG. 4 shows a histogram of the error percentage between the estimated value and the actual bits per frame over 16,118 MP3 frames (approximately 7 minutes of audio). These values show that there is only a small difference between the estimate and the actual number and that the variation in this difference is small.

Use of the method shown in FIG. 2 reduces the computational requirements of an encoder compared to performing the exact calculation (instead of block 21). This reduces the power consumption of the encoder which may be particularly beneficial in embedded devices and other battery powered applications. Additionally, or instead, it allows additional processing power for the encoding step (block 20), enabling the use of more sophisticated encoding methods which give a higher quality compressed signal. In an example, it may allow use of a larger number of finer iterative steps (e.g. smaller changes in quantisation levels) without increasing the overall number of MIPS used for the overall encoding process.

Figure 5:
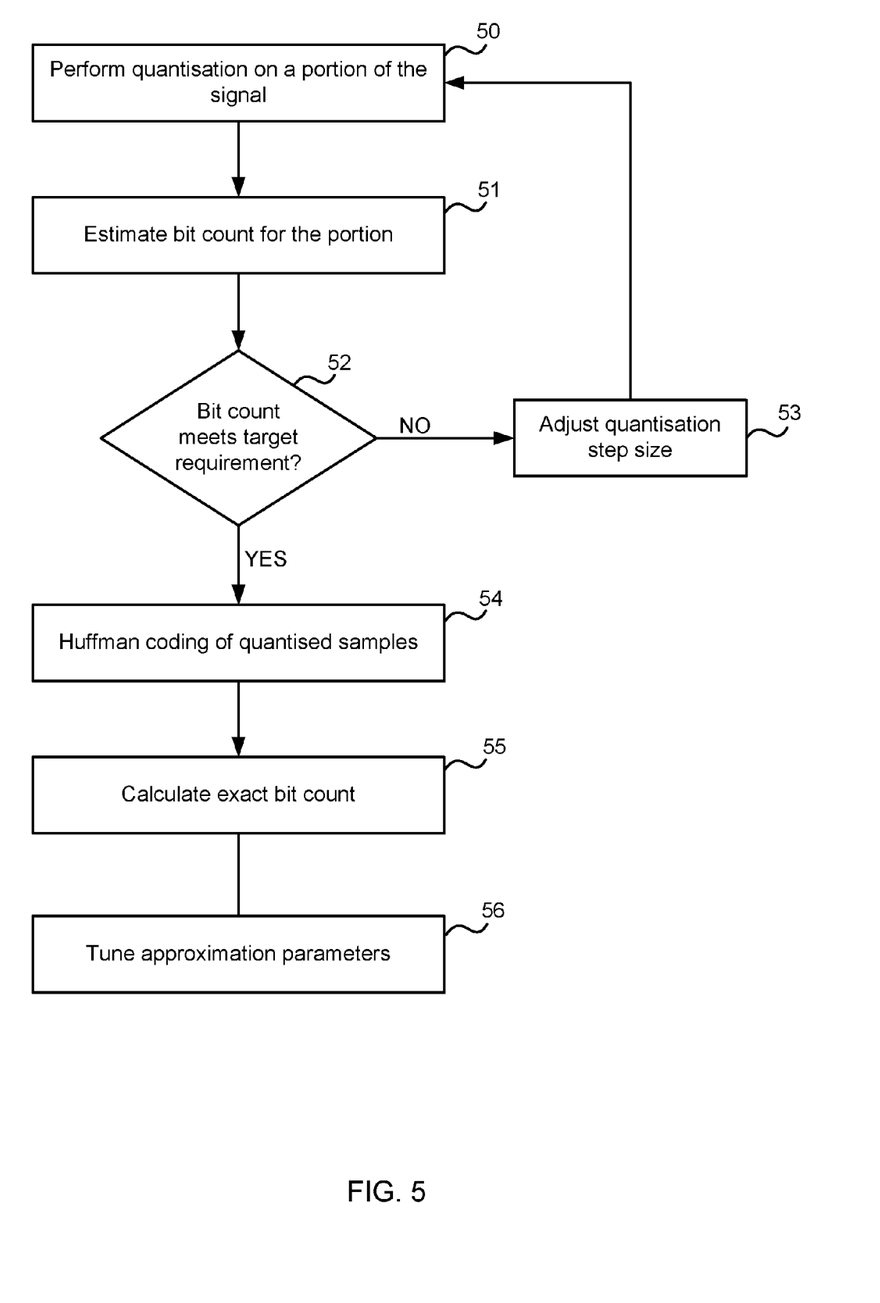
FIG. 5 shows a flow diagram of a second example method of encoding an audio or video signal.

FIG. 5 shows a flow diagram of a second example method of encoding an audio or video signal in which the values of $b_1$ and $b_2$ are tuned during the encoding process. This enables the values of $b_1$ and $b_2$ to be tuned to the particular characteristics of the media file being encoded.

According to the method of FIG. 5, a portion of the audio/video signal is quantised (block 50) and the bit count for the portion (i.e. the number of output bits required) is estimated (block 51). This estimation may be performed using the methods described above. If the estimated bit count does not match the target value ('No' in block 52) the encoding and estimation steps (blocks 50 and 51) are iteratively repeated until the target value is achieved, e.g. through adjustment of the quantisation step size (block 53). Once the bit count matches the target value ('Yes' in block 52), e.g. to within a defined margin, the quantised samples are encoded (block 54) and the exact bit count is calculated (block 55). This exact bit count value can be compared to the earlier estimated value (from block 51) and the parameters $b_1$ and $b_2$ tuned accordingly (block 56).

The initial values of $b_1$ and $b_2$ used in the initial estimation step(s) (block 51) may be initial generic values or values based on the signal type, as described above. Smoothing factors and/or limits to the amount of change made to the parameters $b_1$ and $b_2$ may be applied (in block 55) to ensure that the parameters are tuned based on longer term rather than instantaneously observed effects.

Although the methods and equations described above refer to logarithms to the base 2, the methods are more broadly applicable to any base, n. In any of the equations above, $\log_2 x$ may be replaced as follows:

$$\log_2 x = (\log_n x) \cdot (\log_2 n) \quad (5)$$

Using equation (5) in equation (2) therefore gives:

$$\text{bit\_count} = a_1 \log_2 n \sum_{i=0}^{N-1} \log_n(2|x_i|) + Na_2 \quad (6)$$

Whilst equations (2), (4) and (6) use a sum to combine the logarithms, in other examples the logarithms may be combined in different ways.

Whilst the methods are described above in terms of audio/video encoding, the methods may be applicable to encoding of other data types and to applications where data is compressed through an iterative process to reach a target data size/data rate or where multiple compression techniques need to be compared quickly and simply. The algorithms are particularly applicable where the signal distribution is similar to encoded audio, such that smaller numbers occur more often than larger numbers.

Any range or device value given herein may be extended or altered without losing the effect sought, as will be apparent to the skilled person.

It will be understood that the benefits and advantages described above may relate to one embodiment or may relate to several embodiments. It will further be understood that reference to an item refers to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art.

The invention claimed is:

1. A method of iteratively encoding a portion of a signal comprising:
   quantising the portion of the signal to produce a plurality of quantised samples; and
   estimating an output bit count corresponding to the plurality of quantised samples encoded using a code, the estimated output bit count being based on a sum of logarithms to base n=2 of values of each quantised sample and a total number of samples using:

$$a_1 \sum_i \log_2(2|x_i|) + a_2$$

where $a_1$ and $a_2$ are predefined parameters and $x_i$ are values of each quantised sample.

2. The method according to claim 1, wherein the combination of logarithms to base n of values of each quantised sample comprises a sum of logarithms to base n of values of each quantised sample.

3. The method according to claim 1, further comprising:
   comparing the output bit count to target bit count criteria; and
   when the output bit count does not meet the target bit count criteria, adjusting a quantisation parameter; and
   repeating the quantising and estimating steps.

4. The method according to claim 1, wherein the estimating step is implemented using an instruction for detecting a number of sign bits of a number.

5. The method according to claim 4, wherein the estimating step comprises:
   estimating an output bit count using:

$$b_1 \sum_i \text{SIGNDET}(x_i) + Nb_2$$

where N is the total number of samples, $b_1$ and $b_2$ are predefined parameters and SIGNDET represents the instruction for detecting the number of sign bits of a number.

6. The method according to claim 5, wherein $b_1$ and $b_2$ are selected according to one or more characteristics of the signal.

7. The method according to claim 5, wherein $b_1$ and $b_2$ are selected according to the coding type.

8. The method according to claim 5 further comprising:
comparing the output bit count to target bit count criteria; and
when the output bit count meets the target bit count criteria, calculating an exact output bit count and adjusting values of $b_1$ and $b_2$ according to a difference between the output bit count and the calculated exact output bit count.

9. The method according to claim 1, wherein the values, $x_i$, of each quantised sample are quantised MDCT values.

10. The method according to claim 1, wherein the signal comprises an audio signal or a video signal.

11. The method according to claim 1, wherein the code comprises a Huffman code.

12. An encoder comprising:
a quantiser arranged to quantise a portion of a signal to produce a plurality of quantised samples; and
an estimating element arranged to estimate an output bit count corresponding to the plurality of quantised samples encoded using a code, the output bit count being based on a sum of logarithms to base n=2 of values of each quantised sample and a total number of samples using:

$$a_1 \sum_i \log_2(2|x_i|) + a_2$$

where $a_1$ and $a_2$ are predefined parameters and $x_i$ are values of each quantised sample.

13. The encoder of claim 12, wherein the combination of logarithms to base n of values of each quantised sample comprises a sum of logarithms to base n of values of each quantised sample.

14. The encoder of claim 12, further comprising:
a comparing element arranged to compare the output bit count to target bit count criteria; and
wherein, when the output bit count does not meet the target bit count criteria, the encoder is arranged to adjust a quantisation parameter and repeat the quantisation and output bit count estimation.

15. The encoder of claim 12, wherein the estimating element is arranged to estimate the output bit count using an instruction for detecting a number of sign bits of a number.

16. The encoder of claim 15, wherein the estimating element is arranged to perform:

$$b_1 \sum_i SIGNDET(x_i) + Nb_2$$

where N is the total number of samples, $b_1$ and $b_2$ are predefined parameters and SIGNDET represents the instruction for detecting the number of sign bits of a number.

* * * * *

UNITED STATES PATENT AND TRADEMARK OFFICE
CERTIFICATE OF CORRECTION

PATENT NO. : 8,217,811 B2
APPLICATION NO. : 12/679719
DATED : July 10, 2012
INVENTOR(S) : Hargreaves et al.

It is certified that error appears in the above-identified patent and that said Letters Patent is hereby corrected as shown below:

In Column 2, Line 38, delete "of $x_i$, each" and insert -- $x_i$, of each --, therefor.

In Column 5, Line 65, in Equation (3), delete " $y=SIGNDET(x)=n-\lfloor \log_2 x+0.5 \rfloor -2$ " and insert -- $y = SIGNDET(x) = n - \lfloor \log_2 |x+0.5| \rfloor - 2$ --, therefor.

In Column 8, Line 7, delete "an" and insert -- 'an' --, therefor.

Signed and Sealed this
Second Day of October, 2012

David J. Kappos
*Director of the United States Patent and Trademark Office*